(12) United States Patent
Sahoo et al.

(10) Patent No.: US 8,699,183 B2
(45) Date of Patent: Apr. 15, 2014

(54) WRITE POLE AND SHIELD WITH DIFFERENT TAPER ANGLES

(75) Inventors: Sarbeswar Sahoo, Shakopee, MN (US); Michael Christopher Kautzky, Eagan, MN (US); Hui Tao Brickner, Savage, MN (US); David Christopher Seets, Excelsior, MN (US); Mark T. Kief, Lakeville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 61 days.

(21) Appl. No.: 13/092,753

(22) Filed: Apr. 22, 2011

(65) Prior Publication Data

US 2012/0268845 A1 Oct. 25, 2012

(51) Int. Cl.
*G11B 5/127* (2006.01)
(52) U.S. Cl.
USPC ............ 360/125.03; 360/125.13; 360/125.14; 360/125.15
(58) Field of Classification Search
USPC ............................ 360/125.03, 125.13–125.15
See application file for complete search history.

(56) References Cited

U.S. PATENT DOCUMENTS

| 5,929,526 | A | 7/1999 | Srinivasan et al. |
|---|---|---|---|
| 6,228,235 | B1 | 5/2001 | Tepman et al. |
| 6,846,745 | B1 | 1/2005 | Papasouliotis et al. |
| 7,205,240 | B2 | 4/2007 | Karim et al. |
| 7,268,057 | B2 | 9/2007 | Ryan et al. |
| 7,397,633 | B2 * | 7/2008 | Xue et al. ................... 360/125.3 |
| 8,400,731 | B1 * | 3/2013 | Li et al. .................... 360/125.01 |
| 2007/0253107 | A1 * | 11/2007 | Mochizuki et al. ........... 360/126 |
| 2009/0168240 | A1 * | 7/2009 | Hsiao et al. .............. 360/125.02 |
| 2009/0316304 | A1 * | 12/2009 | Funayama et al. ......... 360/234.3 |
| 2010/0061016 | A1 * | 3/2010 | Han et al. ................... 360/125.3 |
| 2010/0149697 | A1 * | 6/2010 | Nunokawa et al. ........... 360/319 |
| 2010/0157476 | A1 * | 6/2010 | Kudo et al. .............. 360/125.12 |
| 2010/0277832 | A1 * | 11/2010 | Bai et al. .................. 360/125.03 |
| 2011/0090595 | A1 * | 4/2011 | Hirata et al. ............. 360/125.03 |
| 2011/0102942 | A1 * | 5/2011 | Bai et al. .................. 360/125.03 |
| 2012/0154951 | A1 * | 6/2012 | Hsiao et al. .................... 360/122 |

* cited by examiner

*Primary Examiner* — Wayne Young
*Assistant Examiner* — Carlos E Garcia
(74) *Attorney, Agent, or Firm* — Hall Estill Attorneys at Law

(57) ABSTRACT

A first trench sidewall has a continuous first taper angle that terminates at a first plane. At least one layer may be deposited that forms a second trench sidewall with a continuous second taper angle that extends a predetermined depth past the first plane and is less than the first taper angle. A write pole may then be formed on the second trench sidewall with the write pole being closer to the first trench sidewall at the predetermined depth than at the first plane.

20 Claims, 4 Drawing Sheets

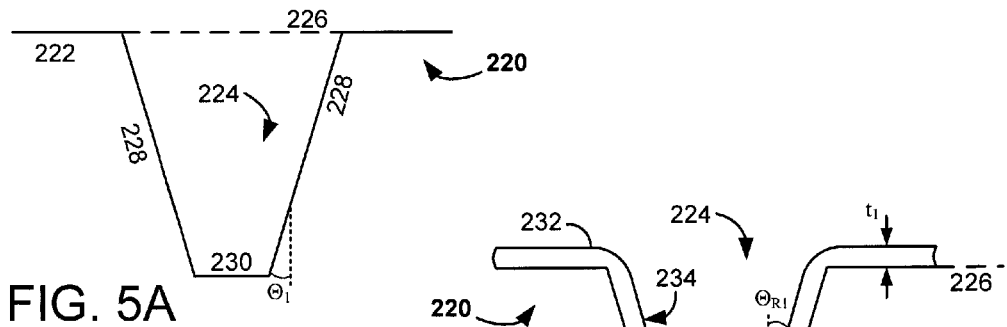
FIG. 5A
FIG. 5B
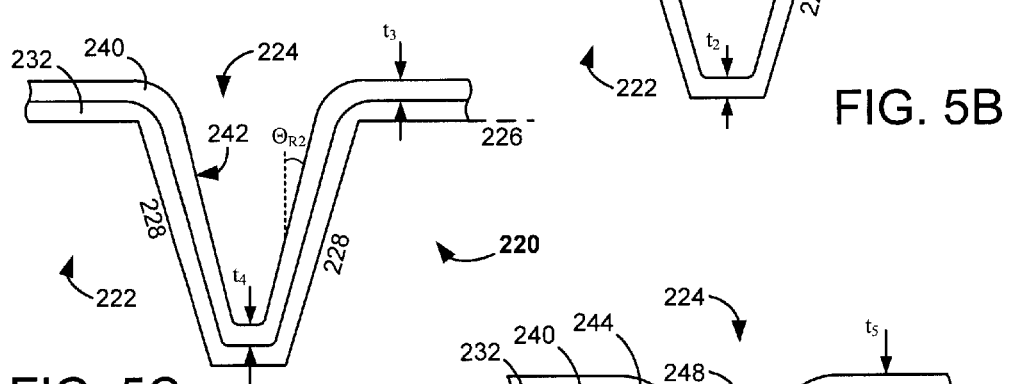
FIG. 5C
FIG. 5D
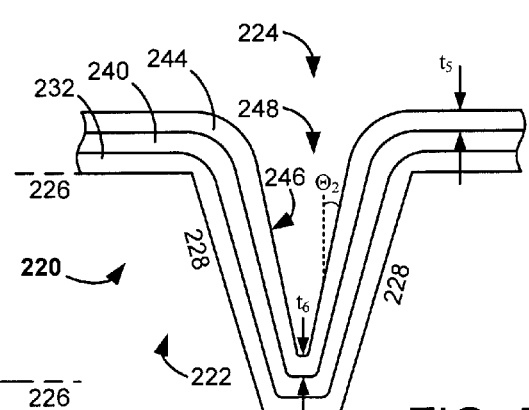
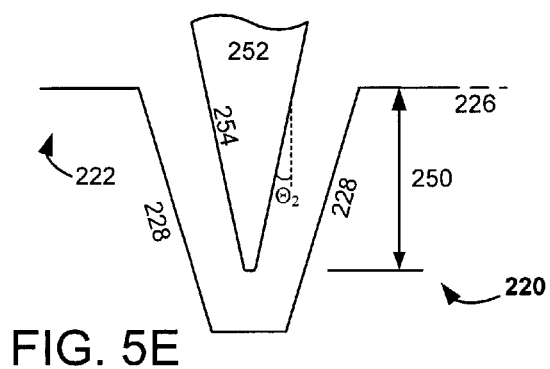
FIG. 5E

WRITE POLE AND SHIELD WITH DIFFERENT TAPER ANGLES

SUMMARY

Various embodiments of the present invention are generally directed to a write pole that may exhibit enhanced trailing edge magnetic fields.

In accordance with various embodiments, a first trench sidewall is provided that has a continuous first taper angle that terminates at a first plane. At least one layer is deposited that forms a second trench sidewall with a continuous second taper angle that extends a predetermined depth past the first plane and is less than the first taper angle. A write pole is then formed on the second trench sidewall with the write pole being closer to the first trench sidewall at the predetermined depth than at the first plane.

BRIEF DESCRIPTION OF THE DRAWINGS

FIGS. 5A-5E illustrate an example of steps used to construct portions of the magnetic element of FIG. 2.

DETAILED DESCRIPTION

The present disclosure generally relates to data storage devices that use magnetic fields to store and retrieve data, such as in the context of writing elements used in data transducing heads. As electronics devices become more sophisticated, demand for higher data capacity with advanced reliability has placed added emphasis on the size of data written to a data storage media. With a higher data capacity often relying on increasing the density bits in a given area on a storage media, the ability for a magnetic writing element to precisely program ever smaller bits without affecting adjacent bits plays an increasingly important role.

While the structural and operational characteristics of a data storage device can be straightforward, the fabrication of such devices can be wrought with difficulties as a result of decreasing form factors. The manufacturing of perpendicular data writing portions of a data storage device can be susceptible to form factor difficulties associated with positioning a write pole between side shields due to the limited space available for a write pole between the shields.

Configuring side shields with features that more precisely define a data track to be written by the write pole can provide operational benefits of enhanced trailing magnetic fields, but further complicate the fabrication of a write pole with intricate orientations between the side shields. One such side shield enhancement orientation is constructing the write pole and side shields with tapered sidewalls that have different taper angles. However, miniscule form factors on the nanometer scale create fabrication challenges to configuring a tapered side shield to allow the formation of a write pole with a differing taper angle due to the build-up of deposited material that spans between side shields to inhibit precise control of write pole taper angle.

Accordingly, various embodiments of the present invention are generally directed to a trench with a first trench sidewall that has a continuous first taper angle that terminates at a first plane and the deposition of at least one non-magnetic layer that forms a second trench sidewall with a continuous second taper angle that extends a predetermined depth past the first plane and is less than the first taper angle. A write pole may then be formed on the second trench sidewall with the write pole being closer to the first trench sidewall at the predetermined depth than at the first plane. By manipulating the deposition of the non-magnetic layer, the taper angle of the second trench sidewall can be controlled to produce a magnetic writer with enhanced operational characteristics, particularly with respect to trailing edge magnetic fields.

Figure 1:
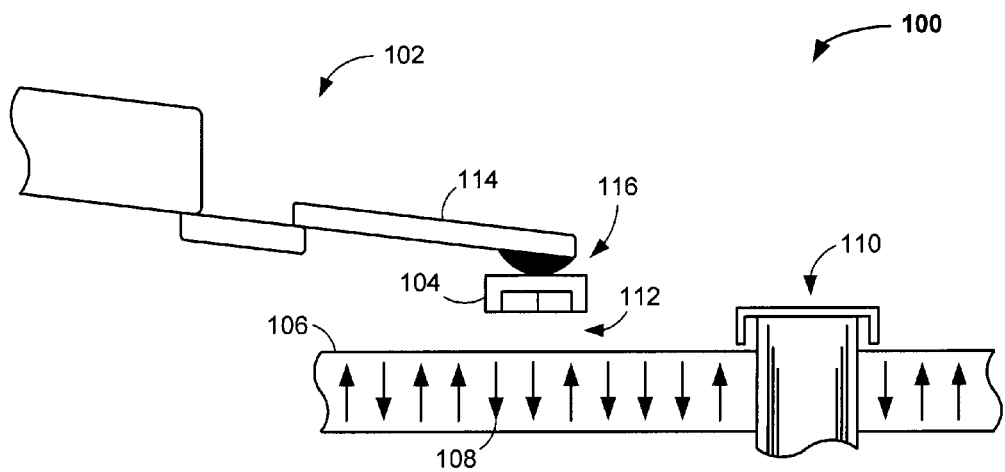
FIG. 1 is a block representation of an example portion of a data storage device.

FIG. 1 generally illustrates an embodiment of a data transducing portion 100 of a data storage device. The transducing portion 100 is present in an non-limited environment in which various embodiments of the present invention can be practiced. The transducing portion 100 has an actuating assembly 102 that positions a transducing head 104 over a magnetic storage media 106 that is capable of storing programmed bits 108. The storage media 106 is attached to a spindle motor 110 that rotates during use to produce an air bearing surface (ABS) 112 on which a slider portion 114 of the actuating assembly 102 flies to position a head gimbal assembly (HGA) 116, which includes the transducing head 104, over a predetermined portion of the media 106.

The transducing head 104 can include one or more transducing elements, such as a magnetic writer and magnetically responsive reader, which operate to program and read data from the storage media 106, respectively. In this way, controlled motion of the actuating assembly 102 causes the transducers to align with tracks (not shown) defined on the storage media surfaces to write, read, and rewrite data.

Figure 2:
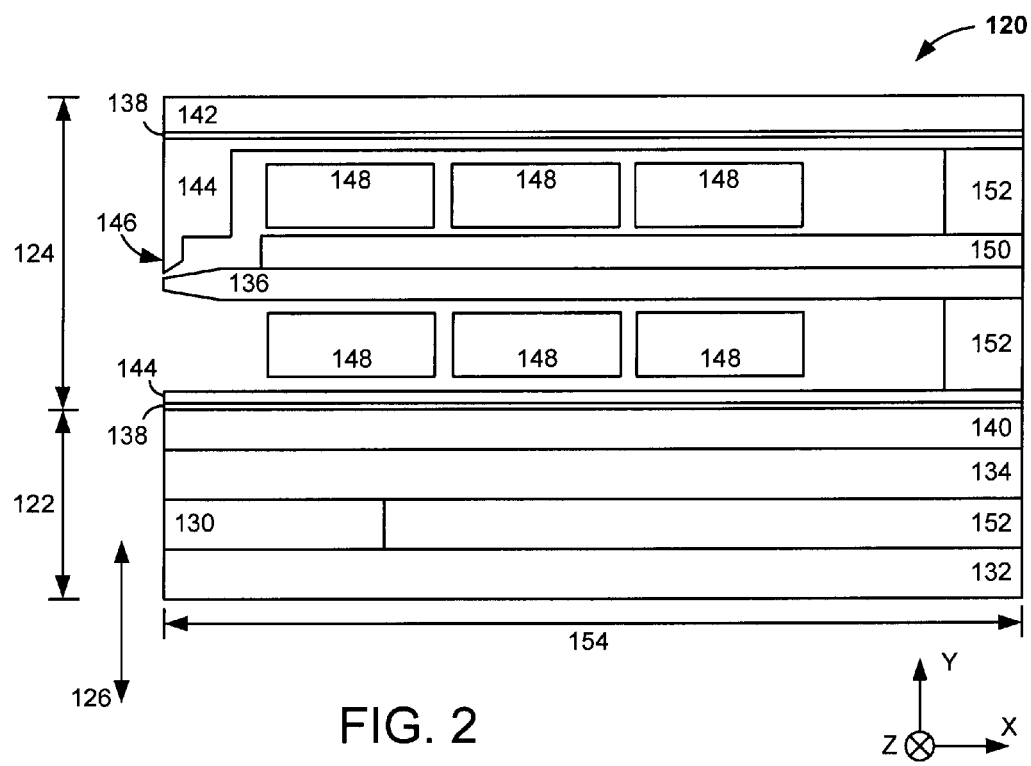
FIG. 2 generally illustrates an embodiment of a magnetic element capable of being used in the portion of the data storage device displayed in FIG. 1.

FIG. 2 displays a cross-sectional block representation of an embodiment of a transducing head 120 that is capable of being used in the actuating assembly of FIG. 1. The head 120 can have one or more magnetic elements, such as the magnetic reader 122 and writer 124, which can operate individually or concurrently to write data to or retrieve data from an adjacent storage media, such as media 106 of FIG. 1. Each magnetic element 122 and 124 is constructed of a variety of shields and a transducing element that act to read data from and write data to a corresponding data medium along a data track 126.

The magnetic reading element 122 has a magnetoresistive layer 130 disposed between leading and trailing shields 132 and 134. Meanwhile, the writing element 124 has a write pole 136 and at least one return pole 138 that creates a writing circuit to impart a predetermined magnetic orientation to the adjacent storage media. In a non-limiting configuration of the write element 124 shown in FIG. 2, two return poles 138 are each contactingly adjacent a non-magnetic gap layer 140 and trailing shield 142, respectively, that prevent flux from the poles 136 and 138 from extending beyond the bounds of the writing element 124. Each return pole 138 further contacts insulating material 144 that maintains magnetic separation of the writing poles 136 and 138.

The operational characteristics of the writer 124 can be improved by configuring the insulating material 144 with an ABS feature 146 that aids in delivering magnetic flux from the write pole 136 to a predetermined area of a rotating media with enhanced precision and accuracy. The writing element 124 further includes a coil 148 that can be one or many individual wires and a yoke 150 that attaches to the write pole 136 and operates with the coil 148 to impart a magnetic flux that travels from the write pole 136 through conductive vias 152 to conclude at the return pole 138. Additional insulating layers can be included, without limitation, to surround the coil 148, write pole 138, and MR layer 130 to prevent leakage of magnetic flux within the transducing head 120.

The shields of the transducing head 120 can be characterized by their position with respect to the timing of encountering external bits, such as bits 106 of FIG. 1. In other words, the shields that encounter the external bits before the transducing elements 122 and 124 are "leading" shields while shields that see the bits after the transducing elements are "trailing" shields. Such characterization extends to the difference between "uptrack" or "downtrack" of the transducing elements in that, depending on the direction of travel for the head 120 and external bits, the shields can be either leading or trailing and either uptrack or downtrack.

The transducing head 120, and each of the respective layers, has a predetermined thickness measured along a Y plane, and a stripe height 154 measured along an X plane. With respect to the shields 132, 134, 140, and 142, the respective shape and dimensions do not vary along the stripe height 154. As such, each shield maintains a predetermined thickness throughout the extent of each shield's stripe height. In contrast, insulating layer 144 has a varying thickness that allows for manipulation of the ABS feature to provide tunable operating characteristics depending on the chosen performance of the writer 124.

While the head 120 has a plurality of shielding layers positioned along the Y axis that dispel magnetic flux from reaching uptrack and downtrack magnetic bits, increased data bit densities have led to the tighter data tracks 126 that often necessitate shielding along the Z axis, especially at the trailing edge of the write pole 136 where large amounts of magnetic flux is emitted and can inadvertently program bits outside the track 126.

With reduced form factors, conventional milling processes cannot reliably form the write pole 136 to fit between the numerous shields proximal to the write pole 136 on the ABS. Further unique difficulties associated with constructing the write pole 136 in reduced form factors is attaining a predetermined taper angle that reduces the thickness of the write pole 136 towards the ABS and provides increased magnetic writing precision. Thus, technology has shifted to constructing the write pole 136 with a damascene process where forming layers of material are configured into the chosen shape, which is cast into the write pole 136, and subsequently removed leaving the write pole 136 free of any fabrication material.

The damascene manufacturing process promises more accurate fabrication with minimal manufacturing steps due to the improved mechanical stability during processing and simpler integration into a final assembly, such as head 120. However, damascene processing is not immune to the effects of reduced form factors as the structural possibilities of the forming layers become limited as write pole shapes and sizes reduce to a nanometer scale. One such difficulty is creating multiple different taper angles between the write pole 136 and shields due to deposited forming material accumulating in unwanted regions and preventing continuous angular sidewalls to be formed.

Accordingly, deposition methods are modified to allow the damascene forming material to continuously coat an underlying tapered surface and transition to another tapered surface with a different taper angle. The use of these modified deposition methods can provide reduced processing cycles and improved tapered throat control while enabling a greater variety of materials to be used to shield the write pole 136. As a result, the write pole 136 can be designed and tuned with a wide array of shapes, taper angles, and materials to provide enhanced magnetic performance in high data bit density applications, as generally illustrated in FIG. 3.

Figure 3:
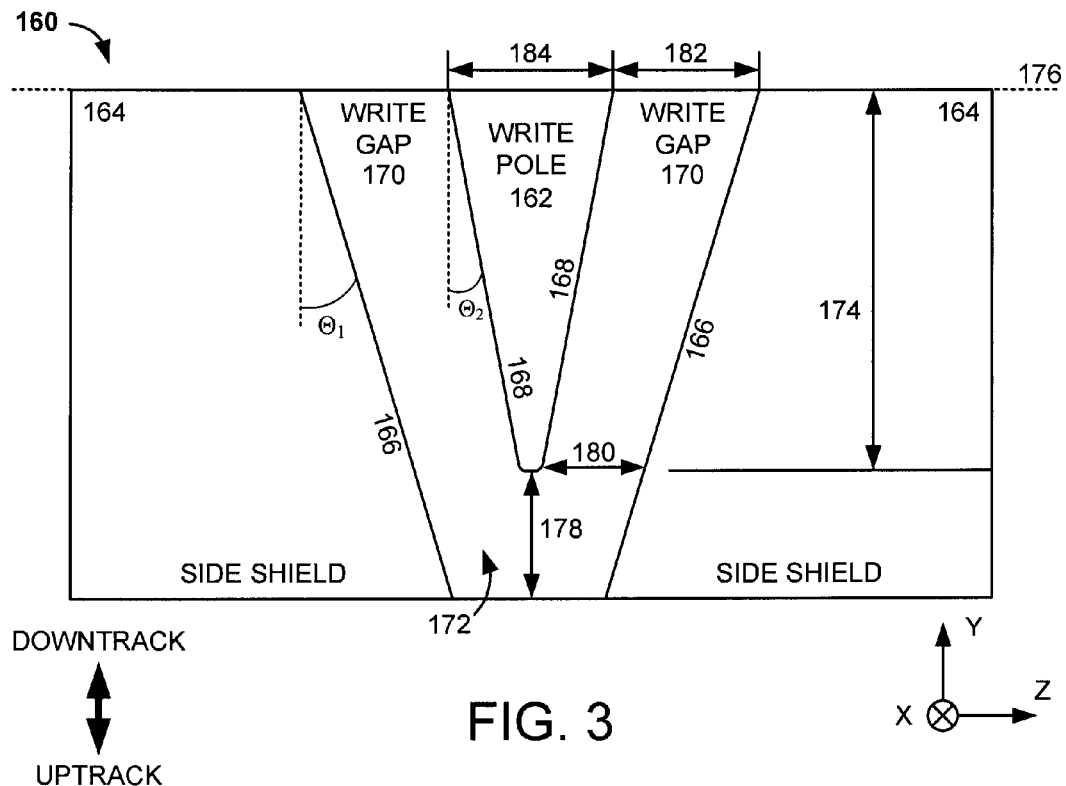
FIG. 3 shows a portion of an embodiment of a magnetic element as viewed from the air bearing surface (ABS).

In FIG. 3, a block representation of a writing portion of an embodiment of a magnetic element 160 is displayed as viewed from the ABS along the Z and Y axes. It is to be understood that FIG. 3 is generally illustrated as aligned with a predetermined track where the bottom portion of the element 160 is uptrack and will encounter a magnetic bit before a downtrack portion at the top of the element 160. As a write pole 162 encounters a rotating magnetic media, side shields 164 work in concert to focus magnetic flux about the write pole 162 and define a write track. As discussed above, the write track can be susceptible to magnetic leakage that can inadvertently program bits distal to the track, despite the addition of the side shields 164 on lateral sides of the write pole 162.

Consequently, one or more of the shields 164 positioned adjacent the write pole 162 can be configured with tapered sidewall surfaces 166 that face tapered sidewall surfaces 168 of the write pole 162 across a write gap 170. While the shield sidewall surfaces 166 can independently have different taper angles, the side shields 164 shown in FIG. 3 form a symmetric trench 172 where each shield sidewall has a first predetermined taper angle ($\Theta_1$) and each write pole sidewall surface 168 has a different second predetermined taper angle ($\Theta_2$). The configuration of the tapered sidewall surfaces 166 and 168 provide enhanced magnetic field operation that minimizes adjacent track interference and side track erasure by more efficiently dispelling magnetic flux generated at the tip of the write pole 162.

The configuration of the write pole 162 and side shields 164 can be further manipulated and tuned without limitation to produce a variety of performance characteristics with highly accurate data writing. One such configuration is to construct the sidewall surfaces 166 and 168 so that the first predetermined taper angle ($\Theta_1$) is greater than the second predetermined taper angle ($\Theta_2$), which is shown in FIG. 3. The differing taper angles ($\Theta_1$ and $\Theta_2$), especially angles of 13 degrees or less, can be particularly difficult to construct on a nanometer scale as the "shadow effect" of deposition methods causes loss of taper angle and pinch-off near the top of the trench 172.

In an example of an optimized embodiment, a 5 degree difference in the predetermined taper angles ($\Theta_1$ and $\Theta_2$) where the first taper angle is 18 degrees and the second taper angle is 13 degrees ($\Theta_1$ and $\Theta_2$) provides a more efficient magnetic write field and shielding performance. The embodiment continues to position the write pole 162 a predetermined depth 174 from a first plane 176 that defines the top of the trench 172. The write pole 162 is further centered in the trench between the trench sidewall surfaces 166 with a tip spacing distance 178 of approximately 70 nanometers.

As a result of the differing taper angles ($\Theta_1$ and $\Theta_2$), the write pole is closer to the trench sidewall surfaces 166 at the depth, as displayed by distance 180, than at the first plane 176, as shown by distance 182. Various embodiments of the magnetic element 160 have the distance 180 as approximately 40 nanometers, the distance 182 as approximately 75 nanometers, and the thickness of the write pole 162 at the first plane 176 as approximately 80 nanometers.

Configuring the write pole 162 to be closer to the trench sidewall surface 166 at depth 174 than at the first plane 176 requires at least one damascene formation layer to continuously coat the trench 172 including both trench sidewall surfaces 166 and the bottom of the trench. The continuous damascene formation layer allows for seamless write pole sidewalls 168 with a sidewall gradient that corresponds with the lower second taper angle ($\Theta_2$). In contrast, conventional deposition methods tend to deposit more formation layer near the top of the trench 172 which creates non-uniform angular gradient along the trench sidewalls 166, particularly when sharp taper angles like 13 degrees is used.

Figure 4:
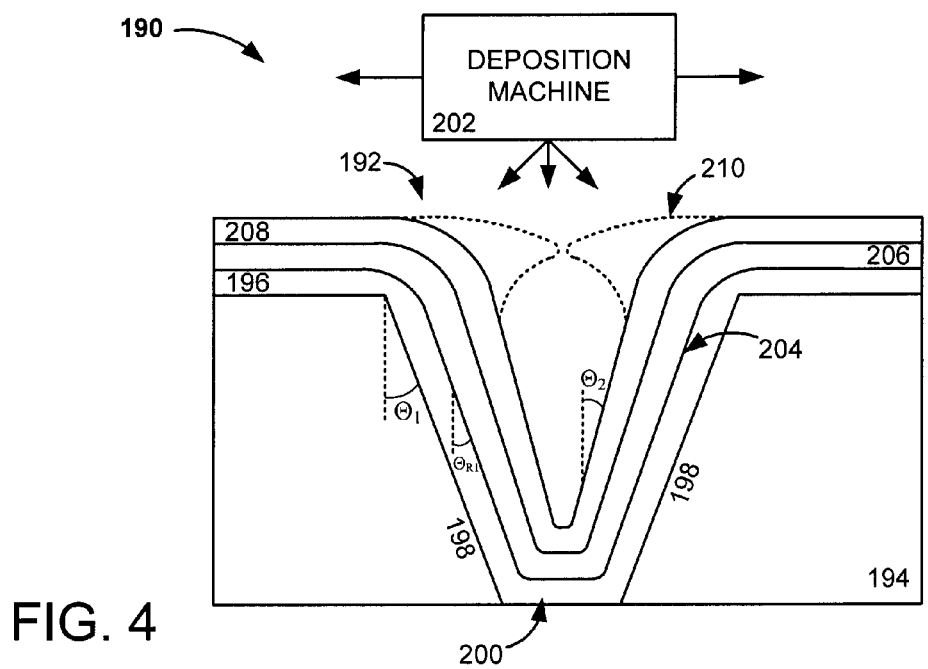
FIG. 4 displays a magnetic element during an embodiment of a fabrication routine.

FIG. 4 illustrates a magnetic writing element 190 amidst a novel deposition method that allows for the transition to a lower taper angle and the formation of a write pole with the structural and operational characteristics of the write pole 162 of FIG. 3. Initially, a reactive ion or inductively-coupled plasma etch process creates a trench 192 in a single piece of material 194, which can be a solid block of material, compound alloy, or lamination of layers that is either kept as side shields, as shown in FIG. 3, or discarded subsequent to the fabrication process.

In order to achieve the write pole structure shown in FIG. 3 with varying taper angles, of which one angle is 13 degrees, a continuous layer formation layer 196 is deposited by a deposition machine 202 on the material 194 so to completely cover the trench sidewalls 198 and bottom 200 while providing an angular gradient that transitions the taper angle ($\Theta_1$) of the trench sidewall 198 to a first formation sidewall 204 that has a reduced taper angle ($\Theta_{R1}$). Depending on the predetermined difference in taper angles ($\Theta_1$ and $\Theta_2$), the first formation layer 196 may be sufficient to properly define the sidewalls of a write pole.

However, if the first formation layer 196 does not have enough angular gradient to transition between taper angles ($\Theta_1$ and $\Theta_2$), additional formation layers are added with optimized thickness so that a subsequently formed write pole will extend the designed depth into the trench 192. As shown, second and third formation layers 206 and 208 further form formation sidewalls with reduced angles that ultimately reach the designed second taper angle ($\Theta_2$). With the sidewall of the third formation layer meeting design specifications, a seed layer can be deposited onto the formation layers 196, 206, and 208 and the write pole is then plated onto the seed layer. With the write pole formed, the formation layers are removed to leave write gap, such as write gap 170 of FIG. 3, which is absent solid material.

The formation layers 196, 206, and 208 can be deposited in a variety of manners by one or more deposition machines 202 to produce continuous layers with an angular gradient. In one deposition process, the deposition machine 202 uses a combination of non-conformal sputtering and conformal chemical vapor deposition (CVD) to allow more formation layer material to be present near the bottom 200 of the trench 192. While any material, or materials, can be used in the combination of sputtering and CVD, various embodiments have Tantalum sputtering intercalated between Ruthenium CVD. The combination of non-conformal sputtering, which is capable of providing angular gradient, with conformal CVD, which is capable of retaining the trench shape and trench sidewall taper angle, allows the deposition of the transition layer 198 without an accumulation of material 210 at the throat of the trench 192 that deforms the continuous taper angle of the formation sidewall 204.

One or more of the formation layers 196, 206, and 208 can be deposited by the deposition machine 202 through controlled-incidence sputtering (CIS) where flux passes through a shutter window onto the rotating material 194 while both shutter and material 194 sweeps laterally in parallel planes. CIS can be used to precisely deposit particles onto the material 194 with a mean angle of incidence relative to the trench 192. The CIS process is controlled, in some embodiments, to produce a mean angle of incidence of 30 degrees and 45 degrees, each of which provide improved angular gradients without throat accumulation 210.

While sputtering alone can be used to deposit one or more formation layers 196, 206, and 208, CVD can also be utilized individually through a starved operation where Ruthenium precursor pulses are minimized to produce gradual reduction of the concentration of reactive gas with increasing depth into the trench 192. The starved CVD deposition results in an optimized angular gradient with an increased surface roughness compared to sputtering alone or with normal CVD. Such roughness contribute to the formation of the write pole in some applications, or the roughness can be polished in a subsequent process that leaves a smoother surface.

In another combination of deposition processes that produce angular gradient without throat accumulation 210, atomic layer deposition (ALD) can be combined with off-axis physical vapor deposition (PVD) to control the development of the formation layers 196, 206, and 208 to create angular gradient on the order of 2 to 5 degrees.

It should be noted that each of the discussed deposition methods are unlimited and can be combined with other processes with or without the addition of supplemental deposition machines 202 to create the formation layers 196, 206, and 208. The deposition methods discussed above have been observed to provide angular gradient on a nanometer scale without the detrimental material accumulation 210 that plagues many other deposition techniques. Thus, any of the methods can be used to deposit one or more layers that combine to transition between the predetermined sidewall angles ($\Theta_1$ and $\Theta_2$) illustrated in FIG. 3.

FIGS. 5A-5E further illustrate an example of a fabrication process for a magnetic write element 220 in accordance with various embodiments of the present invention. FIG. 5A displays a piece of material 222 after a symmetric trench 224 is formed by removing portions of the material 222 below a first plane 226. The trench 224 is defined by an open top at the first plane 226 and opposing trench sidewalls 228 that each have a common taper angle ($\Theta_1$) connected by a substantially horizontal bottom surface 230. As discussed above, the trench can be formed in one, or many, operations of a reactive ion or inductively-coupled plasma etch process that accurately forms the continuous trench sidewall surfaces 228 with the continual taper angle ($\Theta_1$).

FIG. 5B shows the magnetic element 220 after the material 222 has undergone a single a deposition process that produced a continuous formation layer 232 that covers the trench sidewalls 228 and bottom 230 while forming a second trench sidewall 234 that has a first transition taper angle ($\Theta_{R1}$) that is less than the taper angle of the first trench sidewalls ($\Theta_1$). The thickness of the first formation layer 232 varies to accommodate the transition of taper angle from the first trench sidewalls 228 to the second trench sidewalls 234.

As displayed, the formation layer 232 has a first thickness ($t_1$) along the first plane 226 at the throat of the trench and a reduced second thickness ($t_2$) at the bottom 230 of the trench 224 to allow for a gradual increase in formation layer thickness that produces the angular gradient that differs from the underlying first trench sidewalls 228. Although previously mentioned, the first formation layer 232 can be deposited using a number of different methods that include, but are not limited to sputtering, CVD, PVD, CIS, and combinations thereof. That is, multiple deposition methods can be simultaneously or sequentially practiced to produce the single seamless formation layer that has a varying thickness and continuous second transition taper angle ($\Theta_{R1}$).

In the event that the first formation layer 232 does not produce the predetermined taper angle and structural positioning to cast a write pole according to design specifications, a second formation layer 240 is deposited onto the first formation layer 232 to further provide a reduced second transition taper angle ($\Theta_{R2}$), as displayed in FIG. 5C. The second formation layer 240 can be deposited with the any process and materials that may be similar to or different from the first formation layer 232 to produce continuous third trench sidewalls 242 with the second transition taper angle ($\Theta_{R2}$). In an non-limiting embodiment, the second formation layer 240 is deposited with different thicknesses ($t_3$ and $t_4$) than the first formation layer 232 that produce a different angular gradient, which allows for more precise construction of the write pole at a predetermined depth in the trench 224 and predetermined distances from the trench sidewalls 228.

However, if the lamination of the first and second formation layers 232 and 240 do not provide the necessary sidewall taper angle and position in the trench 224, a third formation layer 244, shown in FIG. 5D, is deposited in contacting adjacency with the second formation layer 240. Much as the second formation layer 240 formed the third trench sidewall surface 242, the third formation layer 244 forms a fourth trench sidewall surface 246 that has a continuous angular gradient and taper angle ($\Theta_2$). The method of deposition and thicknesses ($t_5$ and $t_6$) of the third formation layer 244 can be similar or dissimilar to the previously created formation layers 232 and 240 to allow adaptations that provide a cavity in the trench 224 that meets the design specifications for taper angle and clearance from the material 222.

With the formation multilayers 232, 240, and 244 providing a solid and continuous substrate that defines the write pole cavity 248 that meets the predetermined parameters of sidewall taper angle ($\Theta_2$), distance from the trench bottom 230, and depth 250 from the first plane 226, the write pole 252 is cast to conform to the defined write pole cavity 248 and have symmetric pole sidewalls 254 that have the continuous taper angle ($\Theta_2$). FIG. 5E illustrates the cast write pole 252 after the formation layers 232, 240, and 244 are removed, which leaves a write gap 256 between the trench sidewalls 228 and the pole sidewalls 254 that gradually reduces from the depth 250 to the first plane 226.

The material 222 can subsequently be removed or remain to provide shielding of lateral magnetic fields produced from the write pole 252. It should be understood that the various taper angles, shapes, and distances provided in FIGS. 5A-5E are merely examples as any component can be produced with a predetermined taper angle transition configuration through the deposition of formation layers with the novel deposition methods. Furthermore, no single deposition method or combination of deposition techniques are required or limited by the fabrication process illustrated in FIGS. 5A-5E.

Figure 6:
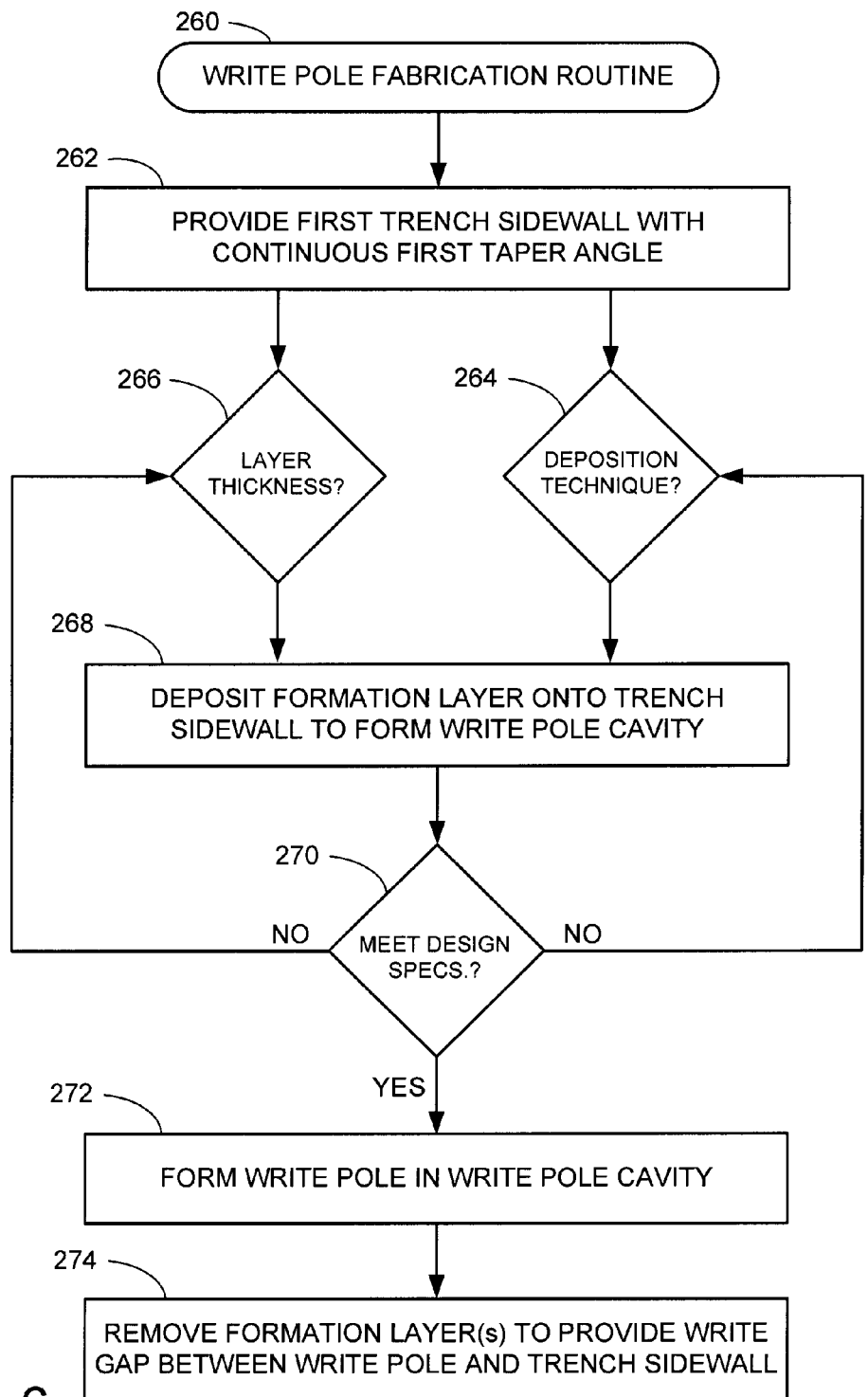
FIG. 6 provides a flowchart mapping an example of a write pole fabrication routine conducted in accordance with various embodiments of the present invention.

As an illustration of the diversity and variety of the deposition methods of the present invention, FIG. 6 provides an example of a element fabrication routine 260 conducted to transition from a first taper angle to a smaller second taper angle. Initially, routine 260 provides a first sidewall with a continuous first taper angle, as displayed in FIG. 5A. A variety of techniques can be used to create one or more sidewalls that have common or dissimilar taper angles. In a non-limiting embodiment, a first sidewall has a first continuous taper angle while a second sidewall has a different second taper angle. In other embodiments, a trench is created in a continuous piece of material that renders multiple laterally symmetric sidewalls that have a common continuous taper angle, such as trench 224 of FIG. 5A.

With a sidewall having a continuous taper angle, the routine 260 proceeds, without distinction to decisions 264 and 266 that respectively determine the thickness of a formation layer and the manner in which the formation layer is to be deposited. As discussed above, several novel deposition techniques, such as the combination of non-conformal sputtering and conformal CVD, can be used in step 268 to produce a continuous formation layer onto the first sidewall to forms a second sidewall that has a reduced continuous taper angle, which is generally illustrated in FIG. 5B.

It bears repeating that the deposition technique determined in decision 264 to deposit a formation layer is not limited to a particular technique or combination of techniques. As such, the various deposition techniques discussed above can be used and combined without restriction to create a wide variety of formation layer characteristics. For example, non-conformal sputtering can be combined with conformal atomic layer deposition just as starved atomic layer deposition can be used individually. The use of these various deposition techniques allow for a complete and seamless formation layer that forms a write pole cavity via the second sidewall.

Decision 270 proceeds to determine if the cavity left formed by the formation layer deposited in step 268 meets the design specifications. Such design specifications can include, but are not limited to, taper angle of the second sidewall, depth from a first plane at the throat of the first sidewall, distance from the first sidewall at the depth, distance from the bottom of the first sidewall, and distance between first and second sidewalls at the first plane. If the second sidewall has properly formed a cavity that meets the predetermined specifications, the routine 260 advances to step 272 where a write pole is cast in the cavity to conform to the shape and dimensions of the second sidewall.

However, if the second sidewall does not meet specifications, decisions 264 and 266 are once again analyzed and decided before a subsequent formation layer is deposited onto the existing formation layer in a return to step 268 that produces another sidewall surface, as shown in FIG. 5C, and further reduces the taper angle while modifying the configuration of the cavity in relation to the previously deposited formation layer. As generally illustrated in FIG. 5D, the routine 260 can continue to deposit formation layers with a variety of thicknesses and deposition techniques until a cavity is formed that meets predetermined specifications.

Conformance of the formation layer cavity with design specifications advances the fabrication routine 260 to step 272 where the write pole is formed, which may involve one or many process steps that may include depositing a seed layer and casting a magnetic write pole from the seed layer. The creation of the write pole in step 272 is accomplished with the formation layers providing a buffer between the first sidewall and the write pole. Step 274 removes the formation layers through an unlimited number of removal techniques that reveal a write gap between the write pole and the first sidewall.

The creation of the write pole with a sharper taper angle than the adjacent first sidewall allows for enhancement of magnetic data recording, especially when the first sidewall corresponds to lateral side shields configured to dispel errant magnetic flux. The precise write gap and position of the write pole at a predetermined depth from a first plane provides optimized magnetic field operation that minimizes side track erasure and adjacent track interference. Furthermore, the ability to accurately tune the formation of the write pole cavity with multiple formation layers that utilize different deposition techniques and thicknesses allows for the optimization of fabrication that reduces the process cycle.

It should be noted, however, that the routine 260 is not required or limited as shown in FIG. 6 as the various decisions and steps can be omitted, changed, and added. For example, the decision of step 270 can be omitted or moved in the event a particular number of formation layers are to be deposited, without monitoring the structural parameters after each formation layer is deposited.

It can be appreciated that the configuration and material characteristics of a magnetic writing element with an optimized write pole described in the present disclosure allows for enhanced magnetic field operation through precise fabrication techniques that allow for improved shielding of errant magnetic flux. Such enhanced magnetic fields improves write field gradient that corresponds to a more accurate data track on a storage media and a reduction in inadvertent programming of data bits on adjacent data tracks. Moreover, the increased precision of the write pole can be tuned and configured to meet a variety of performance characteristics with a damascene fabrication routine that can reduce component processing, even when the components are being manipulated on a nanometer scale. In addition, while the embodiments have been directed to magnetic programming, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising a write pole positioned within a trench, the write pole having first and second pole sidewalls respectively facing first and second trench sidewalls of the trench, the first and second pole sidewalls each having a continuous first taper angle that extends to a write pole tip at a predetermined depth past a first plane on an air bearing surface (ABS), at least two formation layers continuously extending between the first pole and trench sidewalls and around the write pole tip to between the second pole and trench sidewalls, the first and second trench sidewalls each having a continuous second taper angle extending downtrack from the write pole tip on the ABS, the first taper angle being less than the second taper angle, each formation layer having a different taper angle than the second taper angle to transition from the second taper angle to the first taper angle.

2. The apparatus of claim 1, further comprising means for forming the at least two formation layers.

3. The apparatus of claim 2, wherein the means is a combination of non-conformal sputtering and conformal chemical vapor deposition.

4. The apparatus of claim 2, wherein the means is a combination of non-conformal sputtering and conformal atomic layer deposition.

5. The apparatus of claim 2, wherein the means is controlled-incidence sputtering where flux passes through a shutter onto an adjacent wafer, the shutter and wafer simultaneously in motion during deposition.

6. The apparatus of claim 2, wherein the means is starved chemical vapor deposition.

7. The apparatus of claim 2, wherein the means is starved atomic layer deposition.

8. The apparatus of claim 2, wherein the means is a combination of off axis physical vapor deposition and atomic layer deposition.

9. The apparatus of claim 2, wherein the means is a combination of off axis physical vapor deposition and chemical vapor deposition.

10. The apparatus of claim 1, wherein a first distance between the first pole and trench sidewalls at the predetermined depth is less than a second distance between the first pole and trench sidewalls along the first plane.

11. The apparatus of claim 1, wherein the first taper angle is equal to or greater than five degrees less than the second taper angle.

12. The apparatus of claim 1, wherein the first and second trench sidewalls each extend beyond the write pole tip while the write pole extends no further than the write pole tip.

13. The apparatus of claim 1, wherein at least two different non-magnetic materials comprise two of the at least two formation layers and successively coat the first and second trench sidewalls.

14. A method comprising:
configuring a write pole with first and second pole sidewalls each with a continuous first taper angle that extends to a write pole tip at a predetermined depth past a first plane on an air bearing surface (ABS), the first and second pole sidewalls respectively facing first and second trench sidewalls of a trench;
depositing at least two formation layers on a first trench sidewall, the first trench sidewall having a continuous second taper angle extending downtrack from the write pole tip on the ABS that is less than the first taper angle, each formation layer continuously extending between the first pole and trench sidewalls and around the write pole tip to between the second pole and trench sidewalls with a different taper angle than the second taper angle to transition from the second taper angle to the first taper angle; and
forming a write pole on one of the at least one formation layers.

15. The method of claim 14, wherein the at least one of the at least two formation layers is deposited with a combination of non-conformal metal sputtering and conformal chemical vapor deposition.

16. The method of claim 14, wherein the at least one of the at least two formation layers is deposited with controlled-incidence sputtering where flux passes through a shutter onto an adjacent wafer, the shutter and wafer simultaneously in motion during deposition.

17. The method of claim 15, wherein the sputtering is intercalated between chemical vapor deposition of metallic material.

18. The method of claim 16, wherein the controlled-incidence sputtering has a mean incidence angle of particle deposition that is 30 degrees.

19. The method of claim 16, wherein the controlled-incidence sputtering has a mean incidence angle of particle deposition that is 45 degrees.

20. A method comprising providing a trench comprising first and second trench sidewalls each having a continuous first taper angle that extends from downtrack from a write pole tip to a first plane on an air bearing surface (ABS), depositing at least two formation layers onto the first and second trench sidewalls to continuously extend from the first trench sidewall around the write pole tip to the second trench sidewall, each formation layer having a different taper angle than the first taper angle to transition from the first taper angle to a second taper angle, and forming a write pole on one of the at least two formation layers, the write pole having first and second pole sidewalls continuously extending from the write pole tip and respectively facing the first and second trench sidewalls, each pole sidewall positioned further from the trench sidewalls at the first plane than at the write pole tip on the ABS.

\* \* \* \* \*

UNITED STATES PATENT AND TRADEMARK OFFICE
CERTIFICATE OF CORRECTION

PATENT NO. : 8,699,183 B2
APPLICATION NO. : 13/092753
DATED : April 15, 2014
INVENTOR(S) : Sarbeswar Sahoo et al.

It is certified that error appears in the above-identified patent and that said Letters Patent is hereby corrected as shown below:

In the Claims

In Col. 10, Line 22
replace "further"
with "farther"

In Col. 11, Line 10
replace "further"
with "farther"

Signed and Sealed this
Seventh Day of April, 2015

Michelle K. Lee
*Director of the United States Patent and Trademark Office*